This invention relates to thermoelectric circuits utilized for heat-exchange and, more particularly, to a means and method for producing heat or removing heat by way of a thermoelectric couple.

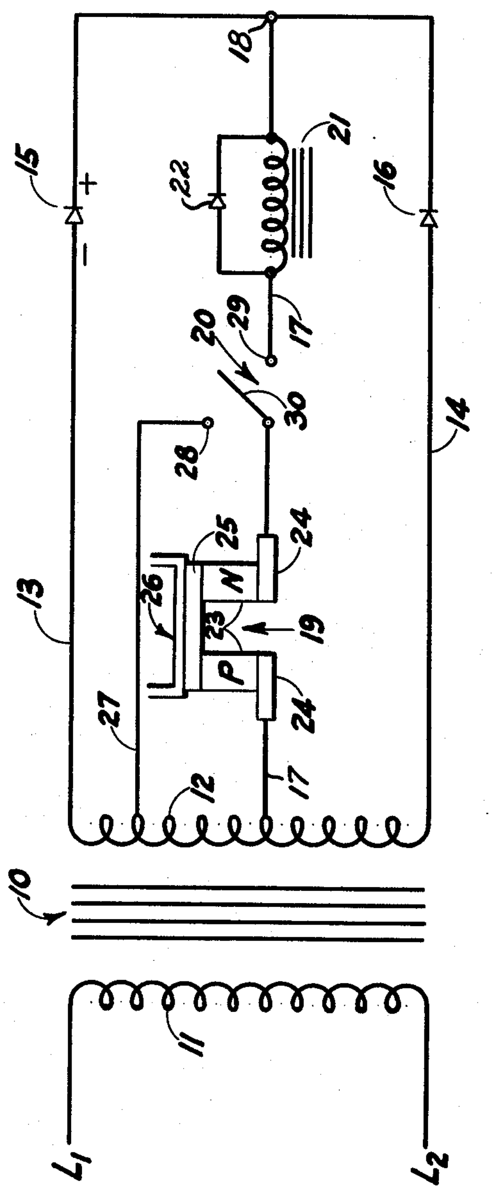
INVENTOR.
WALTER E. BRENEMAN
BY
Sidney N. Rosenfeld
ATTORNEY 3,171,261
THERMOELECTRIC CIRCUITS
Walter E. Breneman, York, Pa., assignor to Borg-Warner Corporation, Chicago, Ill., a corporation of Illinois
Filed Nov. 24, 1961, Ser. No. 154,556
6 Claims. (Cl. 62—3)

Thermoelectric circuits may be utilized to remove heat from or add heat to an element by passing a uni-directional current through a thermoelectric couple forming part of the circuit. Dependent on the direction of the current, heat will be removed from or added to any element in contact with the aforementioned couple.

In cold producing devices, and particularly those adapted to produce ice, it is apparent that normally current will be directed through the thermoelectric couple in a direction to remove heat from the heat-exchange element in contact with the couple. However, at times it becomes necessary to add heat to the element in order to defrost the same, or, with respect to ice makers, in order to break the bond between the element and the ice formed thereon.

The addition of heat to an element by a thermoelectric couple as set out above, can be accomplished by merely reversing the flow of current through the couple. This, however, becomes a very involved, complex, and costly operation.

Applicant has devised a means and method for producing heat in a thermoelectric couple, normally utilized to remove heat from an element, in a forthright, simple, expeditious manner and at a very low cost.

An object of the invention is to provide a method of producing heat by a thermoelectric cold producer, including a thermoelectric couple, by interrupting the flow of unidirectional current to the couple and supplying alternating current thereto.

A further object is to provide a method of removing heat from or adding heat to a heat-exchange element by a thermoelectric couple, which comprises the steps of rectifying alternating current to uni-directional current for supply to the couple when it is desired to remove heat from the element, and interrupting the flow of uni-directional current to the couple and supplying the alternating current directly thereto when it is desired to add heat to the element.

Yet another object is to provide, in a thermoelectric cold producer of the type wherein alternating current is rectified to uni-directional current for supply to a thermoelectric couple in heat-exchange relation with a heat removing element, means for supplying the alternating current directly to the couple without rectifying the same, thereby producing heat by the normal resistance of the couple as desired.

In carrying out the invention, a transformer, including a secondary winding, is utilized with a full wave rectifier circuit for receiving alternating current and for supplying substantially ripple-free uni-directional current to a thermoelectric couple or couples for providing a heat removal effect. A two-position, switch-controlled line leads from the secondary winding of the transformer to the upstream side of the thermoelectric couple, such that, in one position of the switch, the circuit functions as a cold producer as set out above, and, in the other position of the switch, the rectifier circuit is bypassed and alternating current is supplied directly to the thermoelectric couple producing a heating effect therein.

The invention consists of the novel constructions, arrangements and devices to be hereinafter described and claimed for carrying out the above-stated objects and such other objects as will appear from the following description of a preferred embodiment of the invention described with reference to the acompanying drawing, in which:

The figure is a diagrammatic representation of a thermoelectric couple, combined with the thermoelectric circuit of the invention.

A transformer 10 has a primary winding 11 and a secondary winding 12. Lines $L_1$ and $L_2$ lead from any suitable alternating power source to primary winding 11. Secondary winding 12 has attached to the ends thereof a first lead 13 and a second lead 14. Lead 13 has a rectifier 15 connected therein, while lead 14 similarly has a rectifier 16 connected therein. A center tap lead 17 is connected between secondary winding 12, and forms a juncture 18 with leads 13 and 14 downstream of rectifiers 15 and 16. Lead 17 has connected therein a thermoelectric cold producer 19, a single-pole, double-throw switch 20, and a choke coil 21. A rectifier 22 is connected around choke coil 21.

Thermoelectric cold producer 19 comprises at least one thermoelectric couple 23, including proper conductors 24 on the one side thereof and 25 on the other side thereof, for suitable current flow to produce a heat removal effect in conductors 25. An element 26 is in heat-exchange relation with conductor 25 so that any substance, which may be placed in or on element 26, will have the heat removed therefrom.

A lead 27 is connected on one end thereof to secondary winding 12, and on the other end thereof to terminal 28 of switch 20. An inspection of the drawing shows that terminal 29 of switch 20 is connected in lead 17. Single pole 30 of switch 20, in the one position thereof, will, therefore, close the circuit through lead 17, breaking the circuit through lead 27, while, in the other position, will close the circuit through lead 27 and a portion of lead 17.

*Operation*

In operation, alternating current is supplied through lines $L_1$ and $L_2$ to the primary winding 11 of transformer 10. Current flow is induced in the secondary winding 12, and flows through leads 13 and 14, whereupon it is rectified to uni-directional current flow through lead 17. Choke coil 21 acts to suppress the ripple, as is well known in the art. It will be appreciated that this part of the circuit is the normal full wave rectifier circuit. With pole 30 in contact with terminal 29 of switch 20, the substantially ripple-free uni-directional current flows through thermoelectric couple 23, producing a heat removal effect in conductor 25. Since conductor 25 is in heat-exchange relation with element 26, element 26 and whatever may be contained thereon or therein will be suitably chilled. It will be obvious that, if element 26 were filled with water, after a due period of time, the water would be frozen into ice because of the heat removal effect of thermoelectric couple 23.

Assuming that it is desirable to add heat to element 26 for defrosting purposes (or for harvesting purposes, when element 26 is used to freeze ice), then pole 30 is thrown to its second position, contacting terminal 28. This breaks the full wave rectifier circuit and permits alternating current induced in secondary winding 12 to flow directly through lead 27 in switch 20 to thermoelectric couple 23. The alternating current flow through the couple generates heat, since the couple now acts as an ordinary resistor. This heat is transferred to element 26, as aforesaid.

At high D.C. currents, the inductance of choke coil 21 normally will cause arcing between the terminal 29 and pole 30 of switch 20. This is eliminated by rectifier 22 connected around choke coil 21, which acts to oppose the back E.M.F. of choke coil 21.

I wish it to be understood that my invention is not to be limited to the specific constructions and arrangements shown and described, except only insofar as the claims may be so limited, as it will be apparent to those skilled in the art that changes may be made without departing from the principles of the invention.

What is claimed is:

1. Apparatus of the character described comprising a heat conducting element, a thermoelectric couple in heat-exchange relation with said element, means for converting alternating current to rectified and filtered current and for supplying the same to said couple, means bypassing said converting means for supplying said alternating current directly to said couple, and switch means permitting current flow either through said converting means or through said bypass means.

2. Apparatus of the character described comprising a heat conducting element, a thermoelectric couple in heat-exchange relation with said element, a full wave rectifier circuit for receiving alternating current and for supplying uni-directional current to said couple for removing heat from said element, means for bypassing said rectifier circuit and thereby supplying said alternating current directly to said couple for adding heat to said element, and switch means permitting current flow either through said rectifier circuit or through said bypass means.

3. In a thermoelectric cold producer including a thermoelectric couple and a heat conducting element in heat-exchange relation with said thermoelectric couple; transformer means including a secondary winding; a first and a second lead connected to the ends of said secondary winding; first and second rectifiers connected in said first and second leads; a third center tap lead connected from said secondary winding to said first and second leads downstream of said rectifiers, said thermoelectric couple being connected in said third lead; a fourth lead connected to said secondary winding; and switch means connected between said third and fourth leads such that, in one position of said switch, a closed circuit is formed for uni-directional current flow from said secondary winding to said first and second leads and through said third lead and said thermoelectric couple and, in the second position thereof, a closed circuit is formed for alternating current flow from said secondary winding to said fourth lead and through said third lead and said thermoelectric couple.

4. In a thermoelectric cold producer including a thermoelectric couple and a heat conducting element in heat-exchange relation with said thermoelectric couple; transformer means including a secondary winding; a first and a second lead connected to either end of said secondary winding; first and second rectifiers connected in said first and second leads; a third center tap lead connected from said secondary winding to said first and second leads downstream of said rectifiers, said thermoelectric couple being connected in said third lead; a fourth lead connected to said secondary winding intermediate said third lead and one of said first or second leads; a choke coil connected in said third lead between said thermoelectric couple and the connection with said first and second leads; and a single-pole, double-throw switch connected between said third and fourth leads, said switch being between said thermoelectric couple and said choke coil such that, in the first position of said switch, a closed circuit is formed for rectified and filtered current flow from said secondary winding to said first and second leads and through said third lead and said thermoelectric couple and, in the second position thereof, a closed circuit is formed for alternating current flow from said secondary winding to said fourth lead and through said third lead and said thermoelectric couple.

5. In a thermoelectric cold producer including a thermoelectric couple and a heat conducting element in heat-exchange relation with said thermoelectric couple; transformer means including a secondary winding; a first and a second lead connected to either end of said secondary winding; first and second rectifiers connected in said first and second leads; a third lead connected from said secondary winding intermediate said first and second leads to said first and second leads on the positive side of said rectifiers, said thermoelectric couple being connected in said third lead; a fourth lead connected to said secondary winding intermediate said third lead and one of said first or second leads; a choke coil connected in said third lead upstream of said thermoelectric couple; a single-pole, double-throw switch connected between said third and fourth leads, said switch being between said thermoelectric couple and said choke coil, such that, in the first position of said switch, a closed circuit is formed for rectified and filtered current flow from said secondary winding to said first and second leads and through said third lead and said thermoelectric couple and, in the second position thereof, a closed circuit is formed for alternating current flow from said secondary winding to said fourth lead and through said third lead and said thermoelectric couple.

6. Apparatus of the character described comprising a heat conducting element, a thermoelectric couple in heat exchange relation with said element, means for converting alternating current to unidirectional current for supply to said couple whereby heat is removed from said element, means for by-passing said converting means for supplying said alternating current directly to said couple whereby heat is added to said element, and switch means permitting current flow either through said converting means or through said bypass means.

References Cited in the file of this patent

UNITED STATES PATENTS

| | | |
|---|---|---|
| 1,435,255 | Puxon | Nov. 14, 1922 |
| 2,952,724 | Fritts | Sept. 13, 1960 |
| 2,988,899 | Heron | June 20, 1961 |
| 2,991,628 | Tuck | July 11, 1961 |
| 3,005,316 | Scheckler | Oct. 24, 1961 |